(12) United States Patent
Aoki

(10) Patent No.: US 6,291,844 B1
(45) Date of Patent: Sep. 18, 2001

(54) SEMICONDUCTOR MEMORY DEVICE WITH AN IMPROVED LAYOUT OF PROGRAMMABLE FUSES

(75) Inventor: Mamoru Aoki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/288,620

(22) Filed: Apr. 9, 1999

(30) Foreign Application Priority Data

Apr. 9, 1998 (JP) .................................................. 10-097841

(51) Int. Cl.⁷ ...................................................... H01L 27/10
(52) U.S. Cl. .............................................. 257/209; 257/529
(58) Field of Search ...................................... 257/529, 209

(56) References Cited

U.S. PATENT DOCUMENTS 5,015,989 * 5/1991 Wohlfarth et al. ................... 257/529
5,594,273 * 1/1997 Dasse et al. ........................ 257/620

FOREIGN PATENT DOCUMENTS 61-241943   10/1986 (JP) .
 5-243387    9/1993 (JP) .

* cited by examiner

*Primary Examiner*—Sara Crane
(74) *Attorney, Agent, or Firm*—Young & Thompson

(57) ABSTRACT

A layout of fuses for programming a redundancy circuit in a semiconductor device is provided, wherein the fuses are aligned to form at least one straight line which corresponds to at least one alignment of a plurality of bonding pads.

7 Claims, 5 Drawing Sheets

SEMICONDUCTOR MEMORY DEVICE WITH AN IMPROVED LAYOUT OF PROGRAMMABLE FUSES

BACKGROUND OF THE INVENTION

The present invention relates to a semiconductor memory device, and more particularly to a semiconductor memory device having a redundancy circuit.

The redundancy circuit has been used in a semiconductor memory device such as a dynamic random access memory device and a static random access memory device for remedy of defective devices for improvement in yield of the devices. The redundancy circuit is incorporated with a large number of fuses for redundancy remedy programming. Those fuses are provided on a predetermined region where a window is formed so that a laser beam is irradiated through a window onto the fuse to cut the fuse, for which reason any interconnections are prevented from extending through the window region. It is impossible that the fuses are formed under the interconnection layers for reduction in area of the chip. This provides a limitation to reduce the chip size.

In recent years, the scaling up of the memory cells have been improved due to development in scaling down of the transistors and interconnections to be integrated, whereby the redundancy circuit scale is also increased. As compared to the development in design techniques of the transistors and interconnections, the development speed of the fuse pitch design rule is slower, whereby the occupied area of the redundancy circuit is increased. This is one of the serious problem in realizing a possible chip size shrinkage.

FIG. 1 is a plan view illustrative of a conventional layout of a semiconductor memory device having cell plates and fuses. The semiconductor memory device 21 has four plates, bonding pads 24, 25 and sets of fuses 23 provided between adjacent two cell plates 22. The region where the fuses 23 are provided have windows. The programming of the redundancy circuit is carried out by irradiation of the laser through the window onto the fuses. This window region has no interconnections. Namely, any interconnections are required to extend to avoid this window regions having the fuses 23. This provides the limitation of the freedom in design of the layout of the interconnections.

In the above circumstances, it has been required to develop a novel layout of fuses in the redundancy circuits for enabling the chip size to be reduced.

SUMMARY OF THE INVENTION

Accordingly, it is an object of the present invention to provide a novel semiconductor memory device free from the above problems.

It is a further object of the present invention to provide a novel semiconductor memory device having a redundancy circuit with an improved fuse layout for enabling the chip size to be reduced.

The first present invention provides a layout of fuses for programming a redundancy circuit in a semiconductor device, wherein the fuses are aligned to form at least one straight line which corresponds to at least one alignment of a plurality of bonding pads.

The second present invention provides a layout of at least one line-shaped fuse window showing fuses for programming a redundancy circuit in a semiconductor device, wherein the at least one line-shaped fuse has a longitudinal direction which corresponds to at least one alignment of a plurality of bonding pads.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first aspect of the present invention provides a layout of fuses for programming a redundancy circuit in a semiconductor device, wherein the fuses are aligned to form at least one straight line which corresponds to at least one alignment of a plurality of bonding pads.

It is preferable that the fuses are positioned within at least one stripe-shaped fuse layout region extending between adjacent two of forbidden regions for forbidden layout of any interconnections, the forbidden regions respectively surrounding the bonding pads aligned on the at least one straight lines, two longitudinal sides of the at least one stripe-shaped fuse layout region corresponding to opposite edges of the forbidden regions.

It is preferable that the fuses are positioned within at least one stripe-shaped fuse layout region extending outside an outermost one of forbidden the regions where two longitudinal sides of the at least one strip-shaped fuse layout region correspond to opposite edges of the outermost one of the forbidden regions.

It is preferable that the fuses are aligned to form dual straight lines which correspond to dual alignments of a plurality of the bonding pads.

The above first aspect of the present invention is applicable to a semiconductor device having at least one alignment of a plurality of bonding pads, wherein the semiconductor device has the layout of the first aspect of the present invention.

The second aspect of the present invention provides a layout of at least one line-shaped fuse window showing fuses for programming a redundancy circuit in a semiconductor device, wherein the at least one line-shaped fuse has a longitudinal direction which corresponds to at least one alignment of a plurality of bonding pads.

It is preferable that the at least one line-shaped fuse window is positioned within at least one stripe-shaped fuse window layout region extending between adjacent two of the forbidden regions where two longitudinal sides of the at least one stripe-shaped fuse layout region correspond to opposite edges of the forbidden regions.

It is preferable that the at least one line-shaped fuse window is positioned within at least one stripe-shaped fuse window layout region extending outside outermost one of the forbidden regions for where two longitudinal sides of the at least one stripe-shaped fuse layout region correspond to opposite edges of the outermost one of the forbidden regions.

It is preferable that the fuses windows are aligned to form dual straight lines which correspond to dual alignments of a plurality of the bonding pads.

The above second aspect of the present invention is also applicable to a semiconductor device having at least one alignment of a plurality of bonding pads, wherein the semiconductor device has a layout of the second aspect of the present invention.

Figure 1:
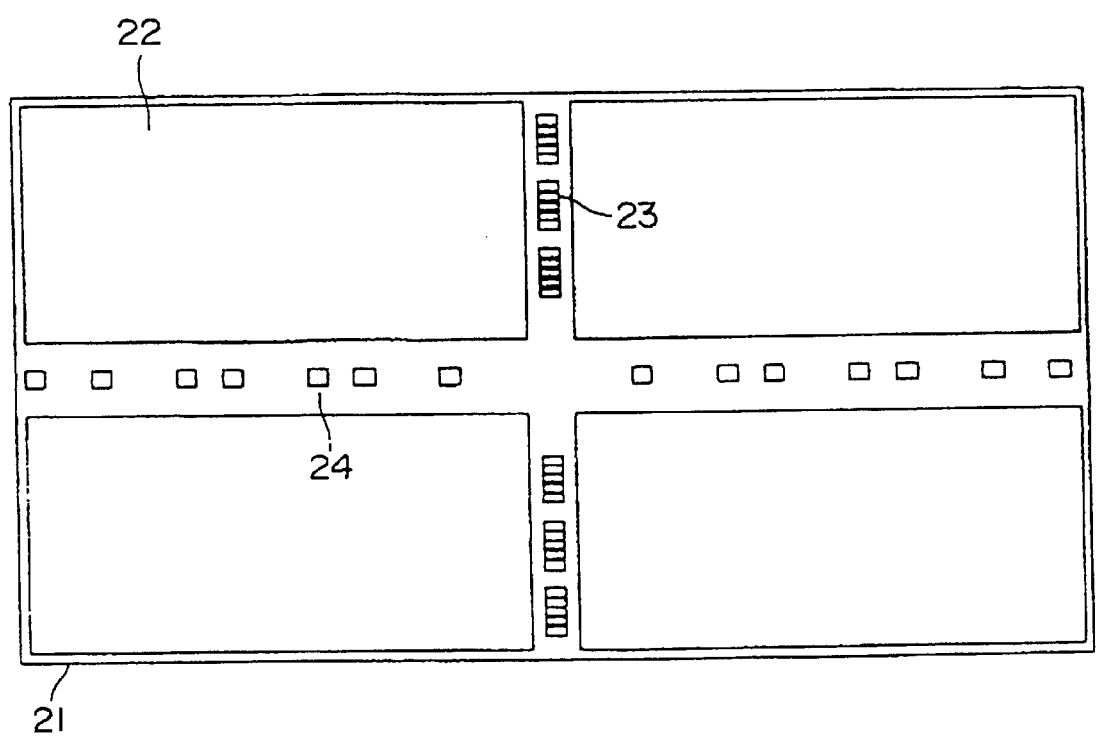
FIG. 1 is a plan view illustrative of a conventional layout of a semiconductor memory device having cell plates and fuses.
Figure 2:
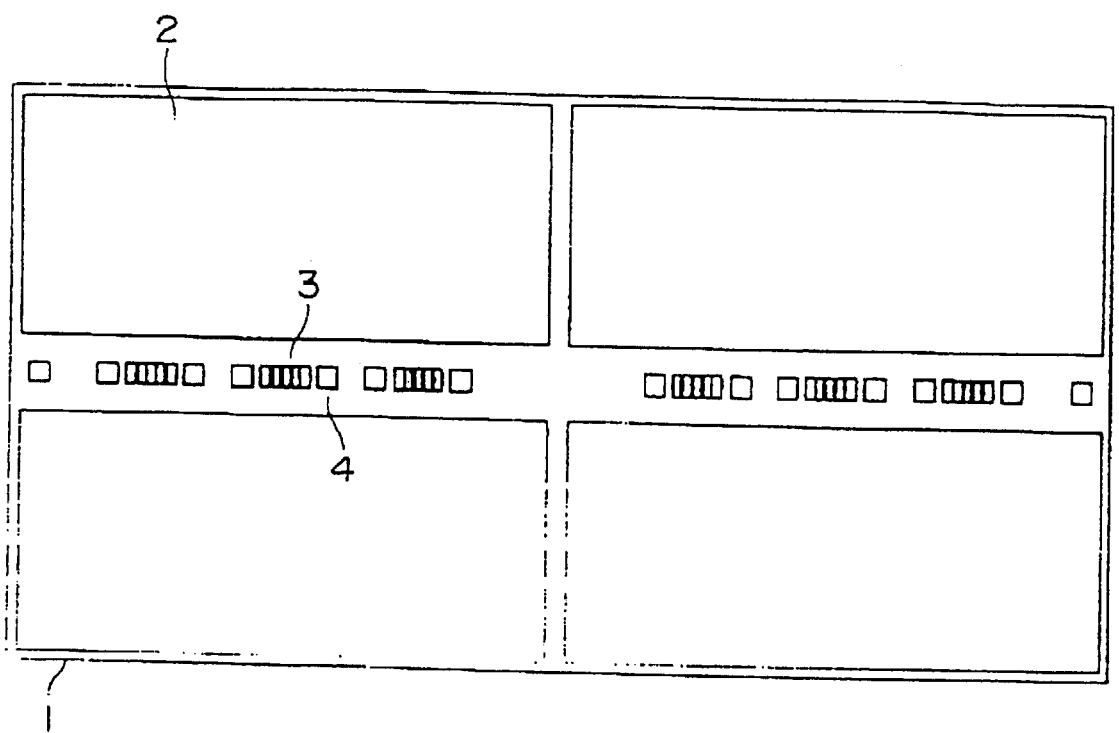
FIG. 2 is a plan view illustrative of a semiconductor memory device with a novel layout of fuses for programming a redundancy circuit in accordance with the present invention.
Figure 3:
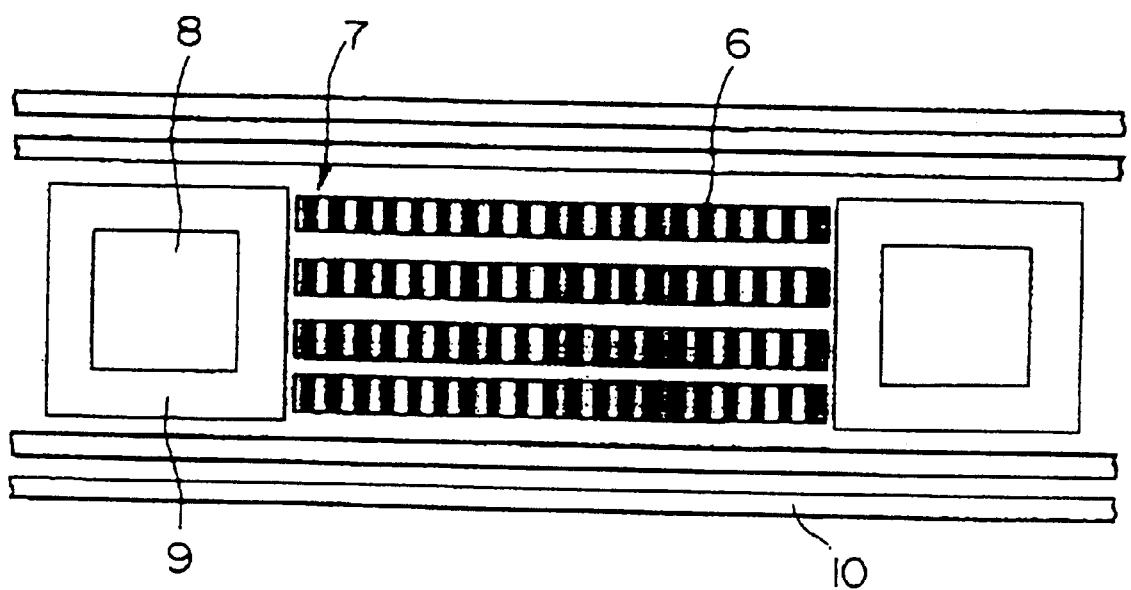
FIG. 3 is a fragmentary enlarged view illustrative of a fuse layout region of fuses between adjacent two of bonding pads in a semiconductor memory device of FIG. 2.

A first embodiment according to the present invention will be described in detail with reference to FIG. 2 which is a plan view illustrative of a semiconductor memory device with a novel layout of fuses for programming a redundancy circuit. The semiconductor memory device 1 has memory cell arrays 2 and sets of fuses 3 and bonding pads 4, wherein the fuses 3 and the bonding pads are aligned on a straight line between the memory cell arrays 2. The fuses 3 are provided for programming addresses of defective memory cells. Those fuses 3 are made of polysilicon. The fuses are cut by a laser trimming. The cut of the fuses changes the defective bit column into a reserved bit column. Each set of the aligned fuses 3 is positioned between adjacent two bonding pads 4 which are aligned on the straight line so that the fuses 3 are also aligned on the straight line, whereby the fuses 3 and the bonding pads 4 are aligned on the single straight line. The fuses 3 are classified into two types, first is the row redundancy fuses for replacing the bit row into the reserved bit row and second is the column redundancy fuses for replacing the column row into the reserved bit row. The row redundancy fuses and the column redundancy fuses are provided in a predetermined band-shaped area which is defined between the adjacent two of the bonding pads and a width of the predetermined band-shaped area is defined by a width of a forbidden region surrounding each of the bonding pads. FIG. 3 is a fragmentary enlarged view illustrative of a fuse layout region of fuses between adjacent two of bonding pads in a semiconductor memory device of FIG. 2. Each of bonding pads 8 has a square-shape of 95 micrometers by 95 micrometers. Further, a forbidden region 9 is formed which comprises a square-shaped band region with a width of 18 micrometers and surrounds each of the bonding pads 8. Second level aluminum interconnections 10 extend to avoid the forbidden regions 9 surrounding the bonding pads 8. The second level aluminum interconnections 10 serve as bus lines for transmission of memory cell data and address signals or serve as power lines and ground lines.

The fuse windows 7 are provided over the fuses 6. These fuse windows 7 are provided within a stripe-shaped fuse window layout region which is defined between the adjacent two of the forbidden regions 9 surrounding the bonding pads 8 and the stripe-shaped fuse window layout region has substantially the same width as the forbidden regions 9. This layout of the fuse windows 7 and the fuses 6 provides no further limitation of layout of the interconnections of the semiconductor memory device. whereby the chip size reduction is possible. It is impossible that the interconnections extend in the region defined between the adjacent two of the bonding pads. The region defined between the adjacent two of the bonding pads is the interconnection layout forbidden region where no interconnections extend. For this reason, the layout of the fuses 6 and the fuse windows 7 within the interconnection layout forbidden region which is defined between the adjacent two of the forbidden regions 9 surrounding the bonding pads 8 and which has the same width as the forbidden regions 9 surrounding the bonding pads 8 provides no limitation in layout of the interconnections.

If the bonding pads are provided or positioned at the center region of the chip, then a cover tape is placed on the chip surface to prevent the leads from being in contact with the chip surface, wherein the cover tape has windows which are positioned in correspondence with the fuse windows for allowing laser irradiations onto the fuses under the fuse windows. The layout of the leads is decided to avoid the window regions of the cover tape. In accordance with the present invention, however, the fuses and the fuse windows are provided within the lead layout forbidden region which is defined between the adjacent two of the forbidden regions surrounding the bonding pads and which has the same width as the forbidden regions surrounding the bonding pads provides no limitation in layout of the leads.

Figure 4:
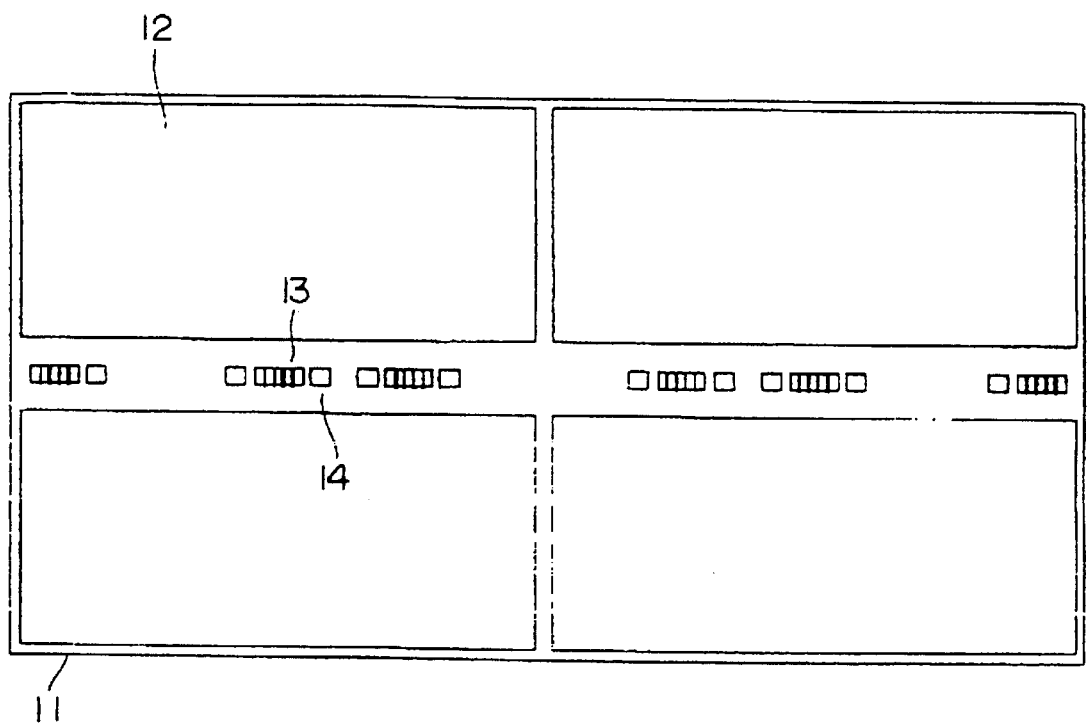
FIG. 4 is a plan view illustrative of a semiconductor memory device with a novel and modified layout of fuses for programming a redundancy circuit in accordance with the present invention.

FIG. 4 is a plan view illustrative of a semiconductor memory device with a novel and modified layout of fuses for programming a redundancy circuit. The semiconductor memory device 11 has memory cell arrays 12 and sets of fuses 13 and bonding pads 14, wherein the fuses 13 and the bonding pads 14 are aligned on a straight line between the memory cell arrays 12. The fuses 13 are provided for programming address of defective memory cells. Those fuses 13 are made of polysilicon. The fuses 13 are cut by a laser trimming. The cut of the fuses 13 changes the defective bit column into a reserved bit column. Four sets of the aligned fuses 13 are positioned between adjacent two bonding pads 14 which are aligned on the straight line and also the remaining two sets of the fuses 13 are positioned outside the most outer bonding pads 14 so that all of the fuses 13 are also aligned on the straight line, whereby the fuses 13 and the bonding pads 14 are aligned on the single straight line. The fuses 13 are classified into two types, first is the row redundancy fuses for replacing the bit row into the reserved bit row and second is the column redundancy fuses for replacing the column row into the reserved bit row. The row redundancy fuses and the column redundancy fuses are provided in a predetermined band-shaped area which is defined between the adjacent two of the bonding pads and a width of the predetermined band-shaped area is defined by a width of a forbidden region surrounding each of the bonding pads. The fuse windows are provided over the fuses 13. This fuse windows are provided within a stripe-shaped fuse window layout region which is defined between the adjacent two of the forbidden regions surrounding the bonding pads 14 and the stripe-shaped fuse window layout region has substantially the same width as the forbidden regions. This layout of the fuse windows and the fuses provides no further limitation of layout of the interconnections of the semiconductor memory device, whereby the chip size reduction is possible. It is impossible that the interconnections extend in the region defined between the adjacent two of the bonding pads. The region defined between the adjacent two of the bonding pads is the interconnection layout forbidden region where no interconnections extend. For this reason, the layout of the fuses 13 and the fuse windows within the interconnection layout forbidden region which is defined between the adjacent two of the forbidden regions surrounding the bonding pads 14 and which has the same width as the forbidden regions surrounding the bonding pads 14 provides no limitation in layout of the interconnections.

Figure 5:
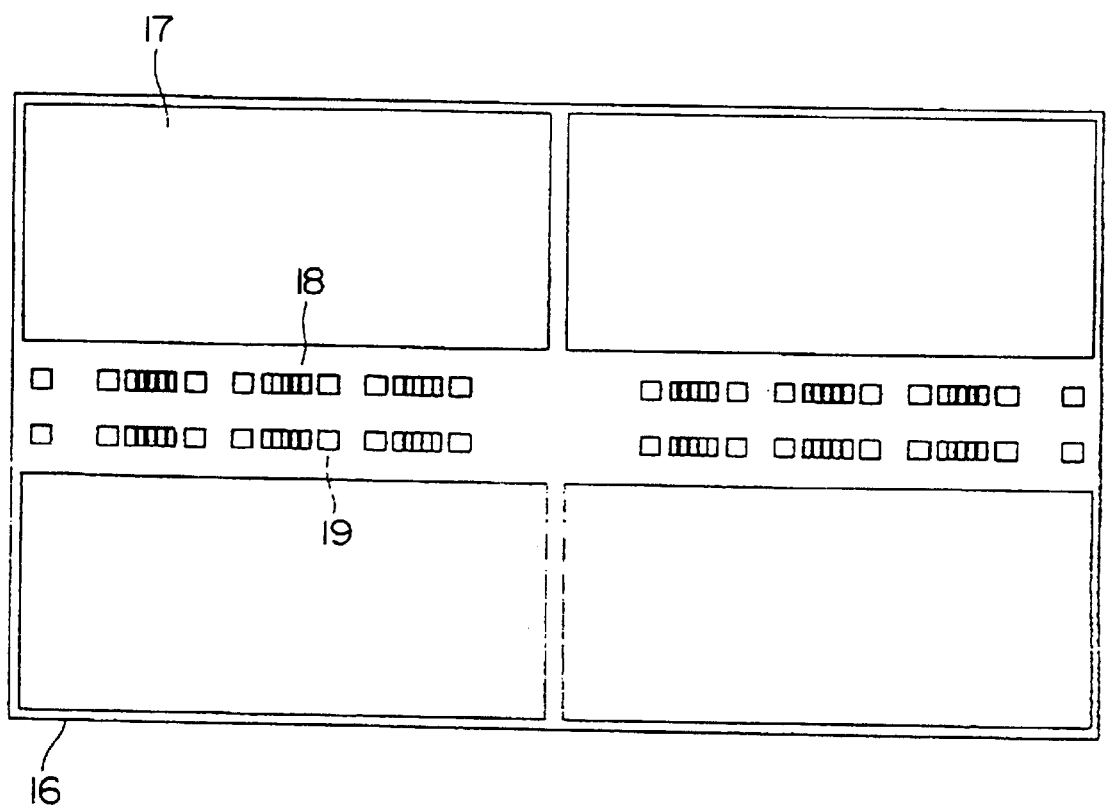
FIG. 5 is a plan view illustrative of a semiconductor memory device with a novel and other modified layout of fuses for programming a redundancy circuit in accordance with the present invention.

FIG. 5 is a plan view illustrative of a semiconductor memory device with a novel and other modified layout of fuses for programming a redundancy circuit. The semiconductor memory device 16 has memory cell arrays 17 and sets of fuses 18 and bonding pads 19, wherein the fuses 18 and the bonding pads 19 are aligned on double straight lines, for example, inside or outside straight lines between the memory cell arrays 17. The fuses 18 are provided for programming address of defective memory cells. Those fuses 18 are made of polysilicon. The fuses 18 are cut by a laser trimming. The cut of the fuses 18 changes the defective bit column into a reserved bit column. Each set of the aligned fuses 18 is positioned between adjacent two bonding pads 19 which are aligned on one of the dual straight lines so that the fuses 18 are also aligned on one of the dual straight lines, whereby the fuses 18 and the bonding pads 19 are aligned on the single one of the dual straight lines. The fuses 18 are classified into two types, first is the row redundancy fuses for replacing the bit row into the reserved bit row and second is the column redundancy fuses for replacing the column row into the reserved bit row. The row redundancy fuses and the column redundancy fuses are provided into a predetermined band-shaped area which is defined between the adjacent two of the bonding pads aligned on one of the dual straight lines and a width of the predetermined band-shaped area is defined by a width of a forbidden region surrounding each of the bonding pads. Each of bonding pads 19 has a square-shape of 95 micrometers by 95 micrometers. Further, a forbidden region is formed which comprises a square-shaped band region with a width of 18 micrometers and surrounds each of the bonding pads 19. Second level aluminum interconnections extend to avoid the forbidden regions surrounding the bonding pads 19. The second level aluminum interconnections serve as bus lines for transmission of memory cell data and address signals or serve as power lines and ground lines. The fuse windows are provided over the fuses 18. This fuse windows are provided within dual stripe-shaped fuse window layout regions, each of which is defined between the adjacent two of the forbidden regions surrounding the bonding pads 19 aligned on one of the dual straight lines, and each of the stripe-shaped fuse window layout regions has substantially the same width as the forbidden regions. This layout of the fuse windows and the fuses 18 provides no further limitation of layout of the interconnections of the semiconductor memory device, whereby the chip size reduction is possible. It is possible that the interconnections extend in the region defined between the adjacent two of the bonding pads aligned on one of the dual straight lines. The region defined between the adjacent two of the bonding pads aligned on one of the dual straight lines is the interconnection layout forbidden region where no interconnections extend. For this reason, the layout of the fuses 18 and the fuse windows within the interconnection layout forbidden region which is defined between the adjacent two of the forbidden regions surrounding the bonding pads 19 aligned on one of the dual straight lines and which has the same width as the forbidden regions surrounding the bonding pads 19 provides no limitation in layout of the interconnections.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A layout of fuses for programming a redundancy circuit in a semiconductor device,
   wherein said fuses are aligned to form at least one straight line which corresponds to at least one alignment of a plurality of bonding pads, and
   wherein said fuses are positioned within at least one stripe-shaped fuse layout region extending between adjacent two of said bonding pads aligned on said at least one straight line, two longitudinal sides of said at least one stripe-shaped fuse layout region being defined by opposite edges of forbidden regions that surround said bonding pads and in which interconnections are prohibited.

2. A layout of fuses for programming a redundancy circuit in a semiconductor device,
   wherein said fuses are aligned to form at least one straight line which corresponds to at least one alignment of a plurality of bonding pads, and
   wherein said fuses are positioned within at least one stripe-shaped fuse layout region whose two longitudinal sides are defined by opposite edges of forbidden regions that surround said bonding pads and in which interconnections are prohibited.

3. A layout of at least one line-shaped fuse window showing fuses for programming a redundancy circuit in a semiconductor device,
   wherein said at least one line-shaped fuse window has a longitudinal direction which corresponds to at least one alignment of a plurality of bonding pads, and
   wherein said at least one line-shaped fuse window is positioned within at least one stripe-shaped fuse window layout region extending between adjacent two of said bonding pads aligned on said at least one straight line, two longitudinal sides of said at least one stripe-shaped fuse layout region being defined by opposite edges of forbidden regions that surround said bonding pads and in which interconnections are prohibited.

4. A layout of at least one line-shaped fuse window showing fuses for programming a redundancy circuit in a semiconductor device,
   wherein said at least one line-shaped fuse window has a longitudinal direction which corresponds to at least one alignment of a plurality of bonding pads, and
   wherein said at least one line-shaped fuse window is positioned within at least one stripe-shaped fuse layout region whose two longitudinal sides are defined by opposite edges of forbidden regions that surround said bonding pads and in which interconnections are prohibited.

5. A semiconductor device comprising a pair of memory cell arrays that are separated by a space, plural bonding pads aligned in a row in the space between the pair of memory cell arrays, and a plurality of fuses that are adjacent to the plural bonding pads and aligned in the row of the plural bonding pads.

6. The semiconductor device of claim 5, wherein said plurality of fuses are between an adjacent pair of the plural bonding pads.

7. The semiconductor device of claim 6, further comprising interconnecting extending through the space between the pair of memory cell arrays generally in parallel with and offset from the row of the plural bonding pads, wherein the plurality of fuses is in a stripe-shaped fuse layout region that has sides defined by the adjacent pair of the plural bonding pads and by two of said interconnections.

* * * * *